US012787694B2

(12) United States Patent
Nerwal

(10) Patent No.: US 12,787,694 B2
(45) Date of Patent: Nov. 3, 2026

(54) SLIDING OUTER TOOL ENCLOSURE

(71) Applicant: KLA Corporation, Milpitas, CA (US)

(72) Inventor: Gurupkar Singh Nerwal, San Jose, CA (US)

(73) Assignee: KLA Corporation, Milpitas, CA (US)

( * ) Notice: Subject to any disclaimer, the term of this patent is extended or adjusted under 35 U.S.C. 154(b) by 478 days.

(21) Appl. No.: 18/331,231

(22) Filed: Jun. 8, 2023

(65) Prior Publication Data

US 2024/0412993 A1 Dec. 12, 2024

(51) Int. Cl.
*H10P 72/00* (2026.01)

(52) U.S. Cl.
CPC ................................ *H10P 72/0616* (2026.01)

(58) Field of Classification Search
CPC ........... H01L 21/6735; H01L 21/67376; H01L 21/67389
See application file for complete search history.

(56) References Cited

U.S. PATENT DOCUMENTS

| | | | |
|---|---|---|---|
| 5,449,289 | A | 9/1995 | Owczarz et al. |
| 5,837,059 | A | 11/1998 | Glants |
| 6,142,722 | A | 11/2000 | Genov et al. |
| 6,533,521 | B1 | 3/2003 | Todorov et al. |
| 7,100,340 | B2 | 9/2006 | Bonora et al. |
| 7,604,449 | B1 | 10/2009 | Kaveh |
| 9,190,304 | B2 | 11/2015 | Macknight et al. |
| 9,943,969 | B2 | 4/2018 | Barker et al. |
| 10,672,633 | B2 | 6/2020 | Rebstock |
| 2003/0053894 | A1 | 3/2003 | Matsumoto |
| 2006/0045665 | A1 | 3/2006 | Hall et al. |
| 2014/0064445 | A1 | 3/2014 | Adler |
| 2015/0233814 | A1 | 8/2015 | Golovanevsky et al. |
| 2020/0126833 | A1 | 4/2020 | Rebstock |

(Continued)

FOREIGN PATENT DOCUMENTS

| | | | | |
|---|---|---|---|---|
| JP | 5470036 B2 * | 4/2014 | ............. | B41J 29/13 |
| KR | 19980012168 A | 4/1998 | | |

(Continued)

OTHER PUBLICATIONS

WIPO, International Search Report and Written Opinion issued for PCT/US2024/030681, Sep. 3, 2024.

(Continued)

*Primary Examiner* — Walter L Lindsay, Jr.
*Assistant Examiner* — Andrew V Do
(74) *Attorney, Agent, or Firm* — Hodgson Russ LLP

(57) ABSTRACT

The system includes a tool disposed in an interior volume. An inner frame having a front wall and a rear wall covers respective front and rear sides of the interior volume, and an outer frame is disposed on the inner frame. The outer frame includes a first section and a second section, each having a top wall, a left wall, and a right wall. In a closed position, the walls of the first section and the second section cover the respective top, left, and right sides of the interior volume, the interior volume is at least partially sealed from the exterior, and the first section is sealed with the second section. The outer frame is movable relative to the inner frame to an open position where at least a portion of the top, left, and right sides of the interior volume are open to the exterior.

20 Claims, 10 Drawing Sheets

(56) References Cited

U.S. PATENT DOCUMENTS

| | | | |
|---|---|---|---|
| 2021/0327736 | A1 | 10/2021 | Fridman et al. |
| 2023/0061147 | A1 | 3/2023 | Shichtman et al. |

FOREIGN PATENT DOCUMENTS

| | | | |
|---|---|---|---|
| KR | 20010050280 | A | 6/2001 |
| TW | I685909 | | 2/2020 |
| WO | 02080232 | A2 | 10/2002 |
| WO | 2018142616 | A1 | 8/2018 |

OTHER PUBLICATIONS

Jin et al., "Photoluminescence spectra of point defects in semiconductors: validation of first principles calculations," arXiv:2106.08608v3, Aug. 2021.

Varian Kestrel 750, Ion Implanter & Monitor, retrieved on Jun. 7, 2023 via https://kr.caeonline.com/buy/ion-implanters-monitors/varian-kestrel-750/9191058 (see images).

* cited by examiner

SLIDING OUTER TOOL ENCLOSURE

FIELD OF THE DISCLOSURE

This disclosure relates to tool enclosures and, more particularly, to enclosures for semiconductor manufacturing tools.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Defect review typically involves re-detecting defects that were detected by an inspection process and generating additional information about the defects at a higher resolution using either a high magnification optical system or a scanning electron microscope (SEM). Defect review is typically performed at discrete locations on specimens where defects have been detected by inspection. The higher resolution data for the defects generated by defect review is more suitable for determining attributes of the defects such as profile, roughness, or more accurate size information.

Metrology processes are used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Semiconductor metrology and inspection tools can be sensitive to temperature fluctuations, particle pollution, electromagnetic interference, and acoustic vibrations from the external tool environment. For example, these external influences may adversely impact the accuracy of measurements collected by metrology tools and the quality of the images collected by inspection tools. Thus, these tools may be operated within an enclosure that can mitigate these external influences. However, existing enclosures are fixed structures that are cumbersome to install and disassemble. For example, when the tool needs to be serviced the entire enclosure needs to be disassembled to access portions of the tool. Some enclosures have doors or access panels to allow access to portions of the tool, but the usefulness of these doors is limited by their size and placement on the enclosure. These disadvantages can increase the time required for servicing and troubleshooting the tool, which can decrease system throughput time.

Therefore, what is needed is an enclosure that can protect the tool and provide for easier access for service and maintenance.

BRIEF SUMMARY OF THE DISCLOSURE

The present disclosure provides a system having a sliding enclosure around a tool. The system may comprise an inner frame, and outer frame, and a tool. The tool may be a semiconductor metrology tool or a semiconductor inspection tool. The inner frame may define an interior volume, and the tool may be disposed in the interior volume. The inner frame may comprise a front wall and a rear wall covering respective front and rear sides of the interior volume. The outer frame may be disposed on the inner frame, and the outer frame may comprise a first section and a second section. The first section may comprise a first top wall, a first left wall, and a first right wall, and the second section may comprise a second top wall, a second left wall, and a second right wall. In a closed position, the first top wall, second top wall, first left wall, second left wall, first right wall, and second right wall may cover respective top, left, and right sides of the interior volume, the interior volume may be at least partially sealed from the exterior, and the first section may be sealed with the second section. The outer frame may be movable relative to the inner frame to an open position where at least a portion of the top, left, and right sides of the interior volume are open to the exterior.

In some embodiments, the first section and the second section may be independently movable relative to the inner frame.

In some embodiments, the first section and the second section may be coplanar. In the open position, the first section may be separated from the second section.

In some embodiments, the first section and the second section may be parallel. In the open position, the first section is disposed on top of the second section.

In some embodiments, the front wall and the rear wall of the inner frame may comprise acoustic dampening panels.

In some embodiments, the first top wall, second top wall, first left wall, second left wall, first right wall, and second right wall of the outer frame comprise acoustic dampening panels.

In some embodiments, the inner frame is secured to a ground surface.

In some embodiments, the system may further comprise a base member. The inner frame and the outer frame may be disposed on top of the base member.

In some embodiments, the base member may comprise guide rails. The outer frame may be movable relative to the inner frame by sliding within the guide rails.

In some embodiments, the first left wall, the second left wall, the first right wall, and the second right wall of the outer frame include wheels, and the outer frame may be movable relative to the inner frame by rolling the wheels.

In some embodiments, the wheels may be retracted in the closed position and extend to allow the outer frame to move relative to the inner frame to the open position by rolling.

In some embodiments, the interior volume may be temperature controlled and at least partially insulated from the exterior in the closed position.

In some embodiments, the tool may be accessible from the top, left, and right sides of the interior volume in the open position.

In some embodiments, the inner frame may further comprise a raceway for routing electrical wires and/or fluid lines connected to the tool.

In some embodiments, the outer frame may further comprise a control panel disposed on one of the first right wall or the first left wall. The control panel may be connected the electrical wires of the tool in the raceway via a flexible relief loop, which can maintain the connection between the control panel and the electrical wires of the tool when the outer frame is in the open position and the closed position.

In some embodiments, at least one of the first left wall, the second left wall, the first right wall, and the second right wall of the outer frame may comprise a door that is openable when the outer frame is in the closed position.

In some embodiments, at least one of the first left wall, the second left wall, the first right wall, and the second right wall of the outer frame may be at least partially transparent.

In some embodiments, the interior volume may be partially sealed from the exterior in the closed position, with a leak rate of 20% or less.

In some embodiments, a pressure differential between the interior volume and the exterior may cause outward airflow between the inner frame and the outer frame in the closed position.

In some embodiments, the inner frame and the outer frame may shield the interior volume from electromagnetic interference in the closed position.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process, step, and electronic changes may be made without departing from the scope of the disclosure. Accordingly, the scope of the disclosure is defined only by reference to the appended claims.

Figure 1:
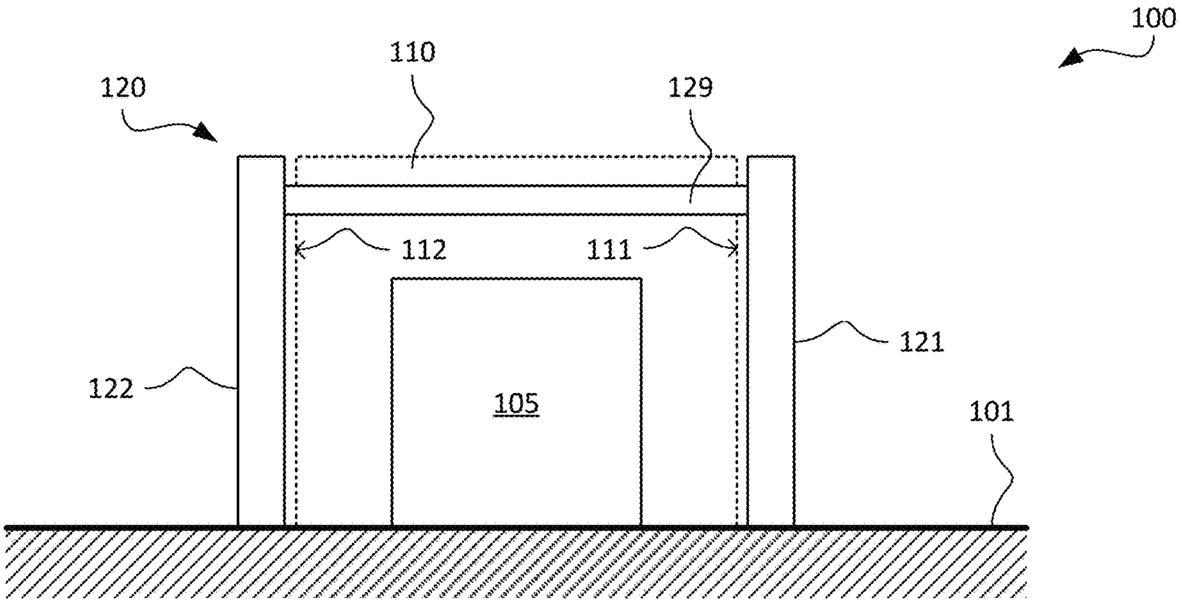
FIG. 1 is a side cross-sectional view of a system of an embodiment of the present disclosure.
Figure 2:
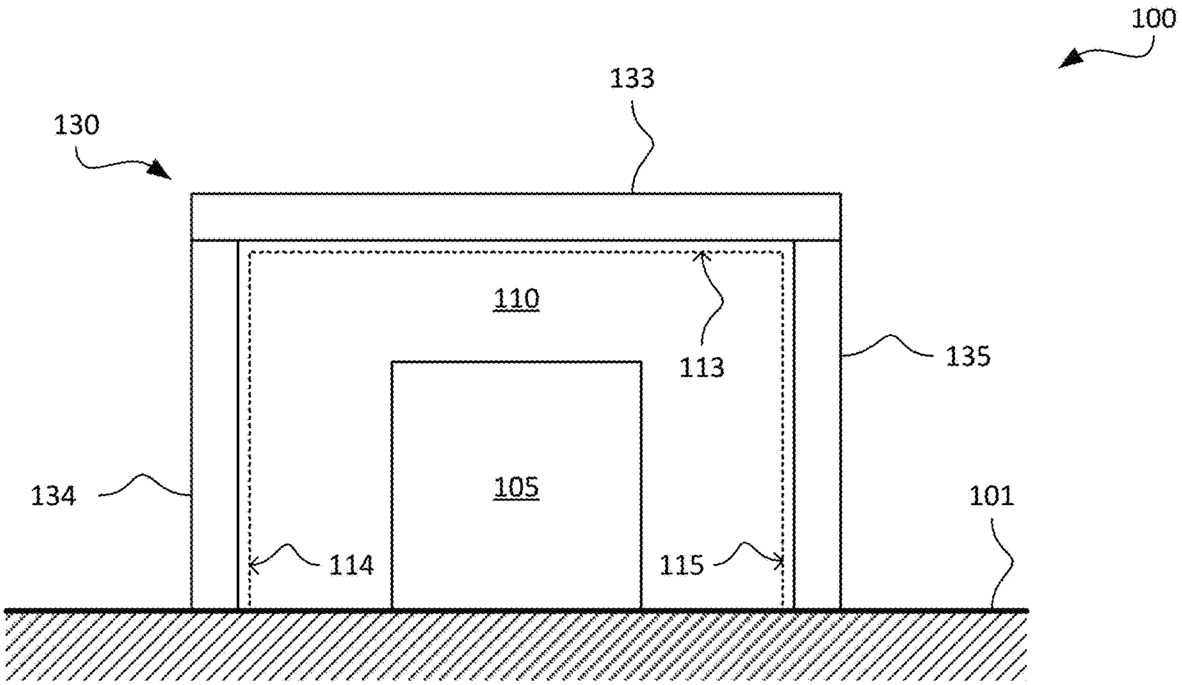
FIG. 2 is a front cross-sectional view of the system of FIG. 1.

An embodiment of the present disclosure provides a system 100, shown in FIGS. 1 and 2. The system 100 may be part of a semiconductor manufacturing system, which performs semiconductor metrology, inspection, or other processes. For example, the system 100 may comprise a tool 105. As used herein, the tool 105 may refer to any tool used to perform measurements on a substrate before, during, after, or between substrate processing steps. For example, the tool 105 may be a semiconductor metrology tool or a semiconductor inspection tool. The tool can use an electron beam, photon beam, x-rays, or ion beam.

A metrology tool is generally configured to perform an analysis by making measurements and providing outputs that correspond to the value of some physical property. The value output is typically a numerical value or set of numerical values, which may be transmitted or stored in analog or digital form. Examples of metrology tools include, but are not limited to overlay tools, interferometers, critical dimension (CD) tools (e.g., CD scanning electron microscope (CD-SEM)), film thickness tools, ion implant metrology tools, surface profiling tools, resistivity metrology tools, reticle pattern placement metrology tools, edge metrology tools, reflectometers, and ellipsometers.

An inspection tool is generally configured to look for defects, i.e., something that is out of the ordinary. Typical output of an inspection tool is a count of defects per area for a substrate or portion of a substrate. Examples of inspection tools include, but are not limited to optical and electron beam wafer inspection systems for patterned or unpatterned wafers, macro defect inspection tools, edge defect inspection tools, infrared inspection tools, and reticle inspection tools. Inspection tools may also be configured for back end of line (BEOL) inspection of fabricated devices. Examples of BEOL inspection tools include, but are not limited to, component inspection tools configured to inspect various semiconductor components that are handled in a tray, such as microprocessors or memory chips. Component defect inspection tool capabilities include, but are not limited to: 3D coplanarity inspection; measurement of the evenness of the contacts; and 2D surface inspection to check the package's surface aspects, the identification mark and the orientation. BEOL inspection tools may also be configured to inspect diced or undiced wafers, or diced wafers mounted on film frame carriers. Such tools may be configured to inspect surface quality of the wafers, the quality of the wafer cutting, or wafer bumps.

The tool 105 may use a light source to perform inspection or metrology processes, such as a white light source, an ultraviolet (UV) laser, an arc lamp or an electrode-less lamp, a laser sustained plasma (LSP) source, a supercontinuum source (such as a broadband laser source), or shorter-wavelength sources such as x-ray sources, extreme UV sources, or some combination thereof. In some embodiments, the tool 105 may use an electron beam or an ion beam. The specific functions and structure of the tool 105 may vary, and is not limited herein.

The system 100 may further comprise an inner frame 120. The inner frame 120 may define an interior volume 110, and the tool 105 may be disposed within the interior volume 110. The geometry and dimensions of the interior volume 110 may depend on the geometry and dimensions of the tool 105 and the inner frame 120. For example, the inner frame 120 may be sized to be larger than the tool 105, so that the tool 105 is completely contained within the interior volume 110. In some embodiments, the inner frame 120 may be sized so that only a portion of the tool 105 is contained within the interior volume 110. In an example, the interior volume 110 may be a rectangular prism having a front side 111, a rear side 112, a top side 113, a left side 114, and a right side 115. The number of sides and overall shape of the interior volume 110 may vary.

As shown in FIG. 1, the inner frame 120 may comprise a front wall 121 and a rear wall 122. The front wall 121 and the rear wall 122 may be on opposite sides of the inner frame 120 and may cover the respective front side 111 and rear side 112 of the interior volume 110. The front wall 121 and the rear wall 122 may comprise acoustic dampening panels. Accordingly, the front wall 121 and the rear wall 122 may prevent external vibrations from affecting the tool 105 entering from the front side 111 and the rear side 112 of the interior volume 110. In some embodiments, the acoustic dampening panels may be 30 to 75 mm thick, but the thickness and/or material may vary depending on the level of acoustic isolation desired for a particular application or tool 105. The front wall 121 and the rear wall 122 may be further configured to shield the interior volume 110 from electromagnetic interference (EMI). For example, the front wall 121 and the rear wall 122 may form a Faraday cage. Accordingly, the front wall 121 and the rear wall 122 may prevent electromagnetic waves in the exterior (e.g., from other tools or system components) from entering the interior volume 110, which can affect measurements and images collected by the tool 105. It should be understood that some tools 105 may have different levels of sensitivity to EMI, and thus the types of shielding, may depend on the particular tool 105.

Figure 3:
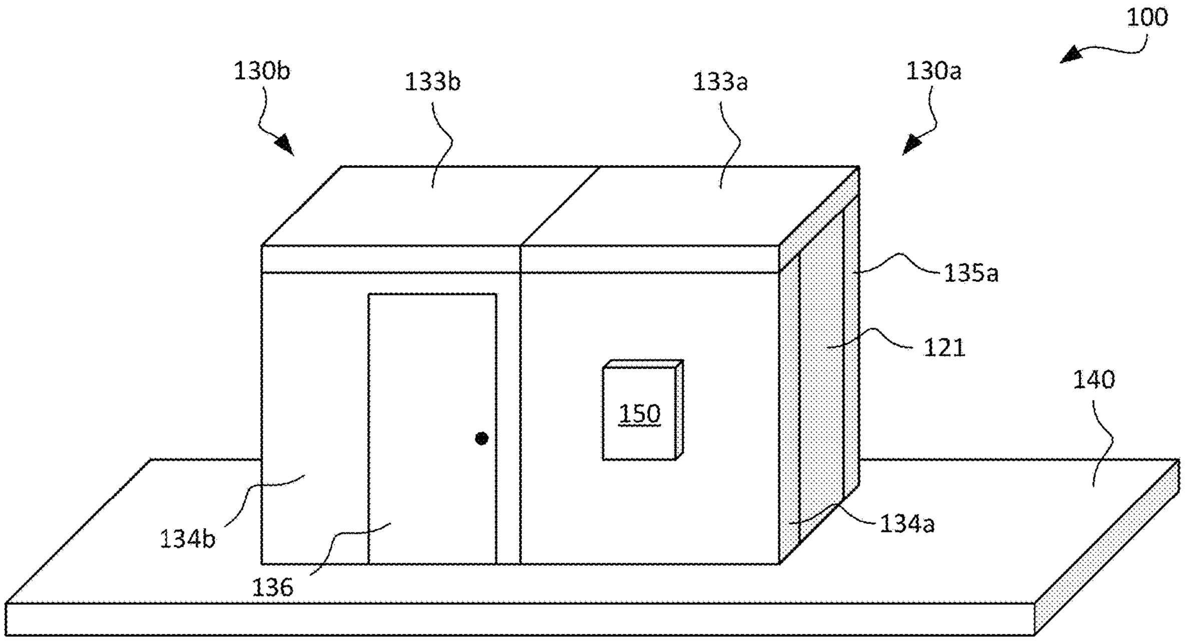
FIG. 3 is a front perspective view of a system of an embodiment of the present disclosure in a closed position.
Figure 4:
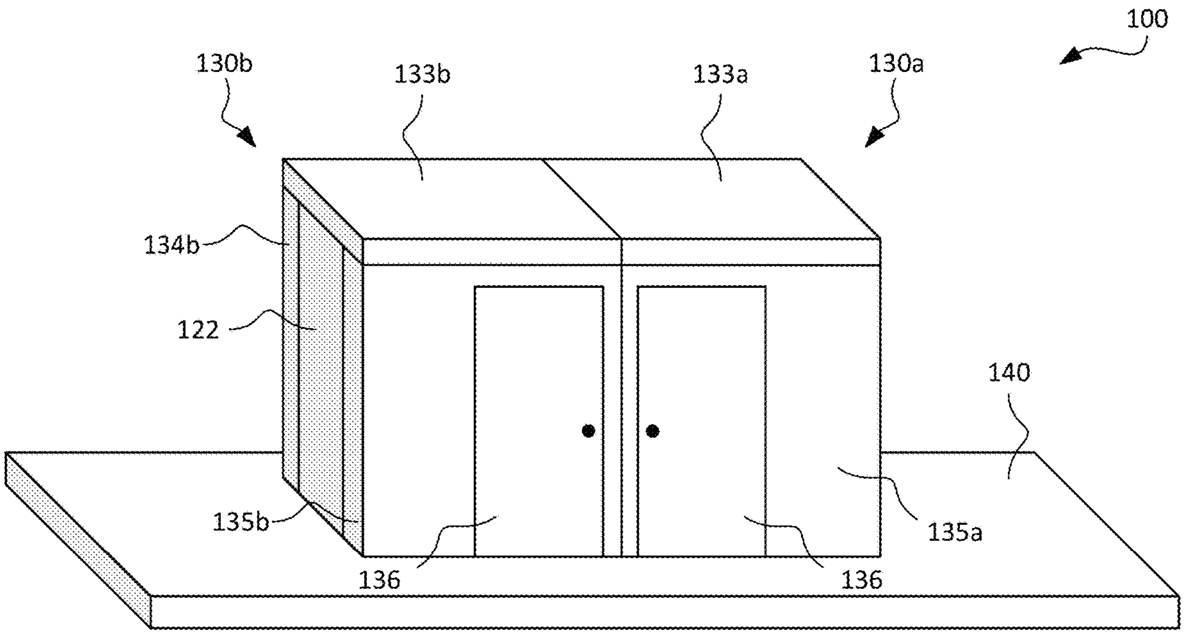
FIG. 4 is a rear perspective view of the system of FIG. 3 in the closed position.

The system 100 may further comprise an outer frame 130. The outer frame 130 may be disposed on the inner frame 120. As shown in FIG. 2, the outer frame 130 may comprise a top wall 133, a left wall 134, and a right wall 135. The left wall 134 and the right wall 135 may be on opposite sides of the outer frame 130, and may be connected by the top wall 133. The top wall 133, left wall 134, and right wall 135 may cover the respective top side 113, left side 114, and right side 115 of the interior volume 110. The top wall 133, left wall 134, and right wall 135 may comprise acoustic dampening panels. Accordingly, the top wall 133, left wall 134, and right wall 135 may prevent external vibrations from affecting the tool 105 entering from the top side 113, left side 114, and right side 115 of the interior volume 110. In some embodiments, the acoustic dampening panels may be 30 to 75 mm thick, but the thickness and/or material may vary depending on the level of acoustic isolation desired for a particular application or tool 105. The top wall 133, left wall 134, and right wall 135 may be further configured to shield the interior volume 110 from electromagnetic interference. For example, the top wall 133, left wall 134, and right wall 135 may form a Faraday cage. Accordingly, the top wall 133, left wall 134, and right wall 135 may prevent electromagnetic waves in the exterior (e.g., from other tools or system components) from entering the interior volume 110, which can affect measurements and images collected by the tool 105. At least one of the top wall 133, left wall 134, and right wall 135 may be at least partially transparent. Accordingly, a portion of the interior volume 110 and the tool 105 may be visible through the outer frame 130. At least one of the top wall 133, left wall 134, and right wall 135 may comprise a door 136, as shown in FIGS. 3 and 4. The door 136 may be hinged or slidable to be opened. Accordingly, a portion of the interior volume 110 and the tool may be accessible via the door 136. The door 136 may be comprised of the same acoustic dampening panels (e.g., having the same material and thickness) as the surrounding top wall 133, left wall 134, or right wall 135. The door 136 may comprise other features (e.g., interlock switches, grounding, etc.) which may comply with Semiconductor Equipment and Materials International (SEMI) requirements.

The outer frame 130 may be moveable relative to the inner frame 120 between a closed position and an open position. In the closed position shown in FIGS. 3 and 4, the front wall 121, rear wall 122, top wall 133, left wall 134, and right wall 135 of the inner frame 120 and outer frame 130 may cover the respective front side 111, rear side 112, top side 113, left side 114, and right side 115 of the interior volume 110. Accordingly, the interior volume 110 may be at least partially sealed from the exterior by the inner frame 120 and the outer frame 130. For example, in the closed position, the interior volume 110 may have a leak rate of 20% or less. As such, the interior volume 110 may not be completely sealed from the exterior. In some embodiments, there may be a pressure differential between the interior volume 110 and the exterior. This pressure differential may cause outward airflow from the interior volume 110 between the inner frame 120 and the outer frame 130 based on the leak rate. Leaks may occur at other locations, such as around the door 136, at the joints between the top wall 133 and the left wall 134 or the right wall 135, or at cable feedthrough cutouts. Such outward flow may prevent contaminants from entering the interior volume 110, which can affect measurements and images collected by the tool 105. In some embodiments, the interior volume 110 may be temperature controlled and at least partially insulated from the exterior. For example, the front wall 121, rear wall 122, top wall 133, left wall 134, and right wall 135 of the inner frame 120 and outer frame 130 may be comprised of an insulating material, which can help prevent fluctuations in the temperature of the interior volume 110 despite changes in the external temperature. The materials and thicknesses of the front wall 121, rear wall 122, top wall 133, left wall 134, and right wall 135 may depend on a desired level of thermal insulation for a particular application or tool 105.

Figure 5:
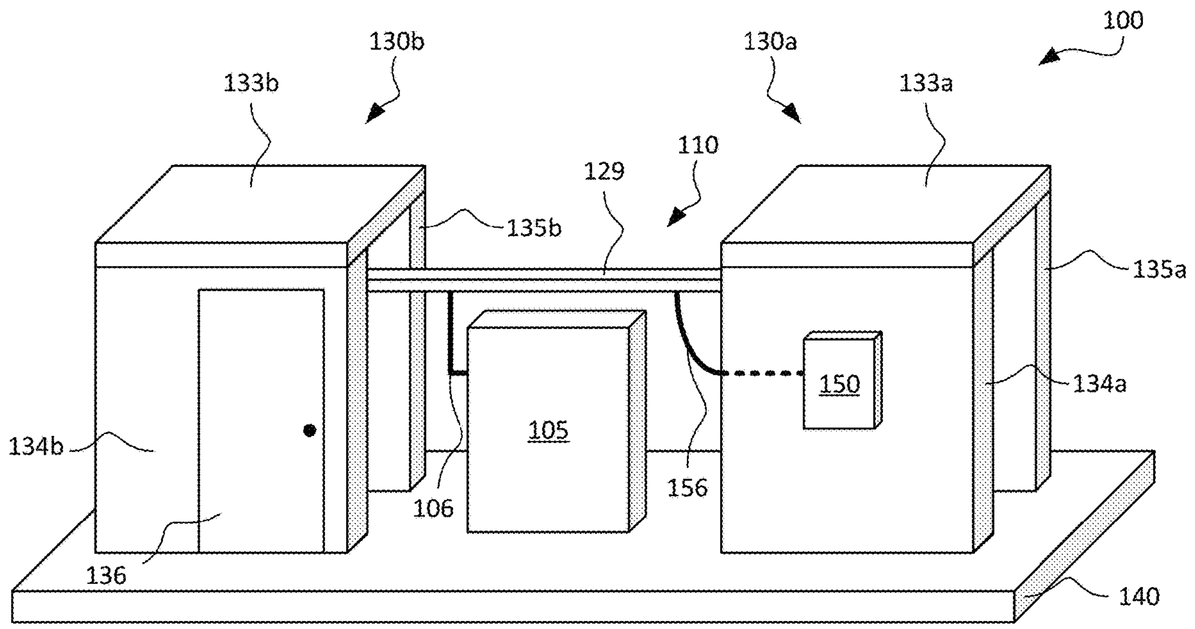
FIG. 5 is a front perspective view of the system of FIG. 3 in an open position.

In the open position shown in FIG. 5, the top wall 133, left wall 134, and right wall 135 of the outer frame 130 are moved such that at least a portion of the top side 113, left side 114, and right side 115 of the interior volume 110 are open to the exterior. Accordingly, the tool 105 may be accessible from the exterior by the top side 113, left side 114, and right side 115 of the interior volume 110. The outer frame 130 may be movable relative to the inner frame 120 by pushing or pulling any one of the top wall 133, left wall 134, or right wall 135. In other words, pushing or pulling any one of the top wall 133, left wall 134, or right wall 135 may cause corresponding movement of the other walls based on the connection between the top wall 133, left wall 134, and right wall 135.

In some embodiments, the inner frame 120 may be disposed on a ground surface 101. The particular type of ground surface 101 may depend on the environment of the system 100 and is not limited herein. The inner frame 120 may be secured to the ground surface 101 by one or more anchors and is not limited herein. Accordingly, the inner frame 120 and the interior volume 110 may be fixed in position, and the outer frame 130 may be movable relative to the fixed inner frame 120.

The system 100 may further comprise a base member 140. The base member 140 may be disposed on the ground surface 101. For example, the base member 140 may be secured to the ground surface 101 by one or more anchors, and is not limited herein. The inner frame 120 and the outer frame 130 may be disposed on the base member 140. For example, the inner frame 120 may be secured to the base member 140 by one or more anchors, and is not limited herein Accordingly, the base member 140 may provide a flat surface to which the inner frame 120 and the tool 105 can be mounted.

Figure 6:
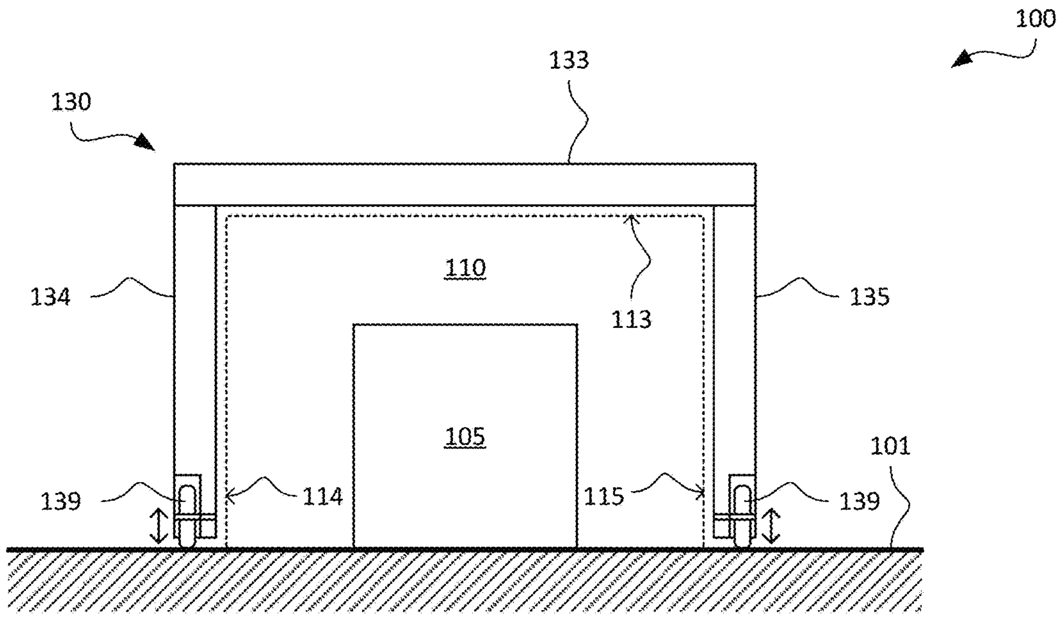
FIG. 6 is a front cross-sectional view of a system of an embodiment of the present disclosure.
Figure 7:
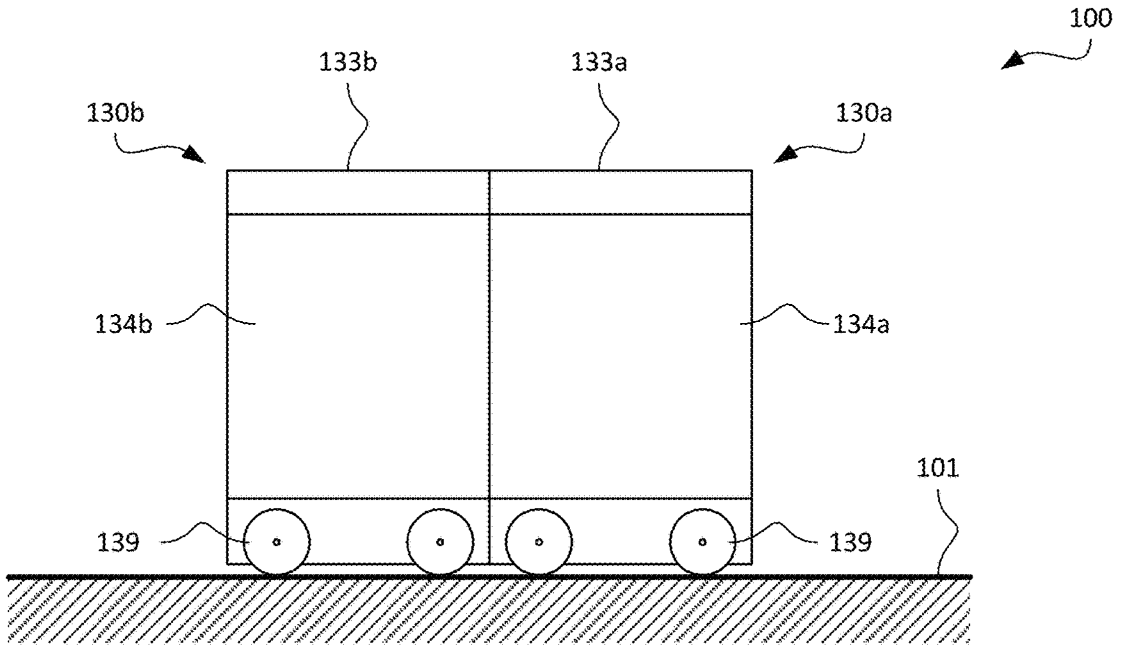
FIG. 7 is a side view of the system of FIG. 6 in a closed position.
Figure 8:
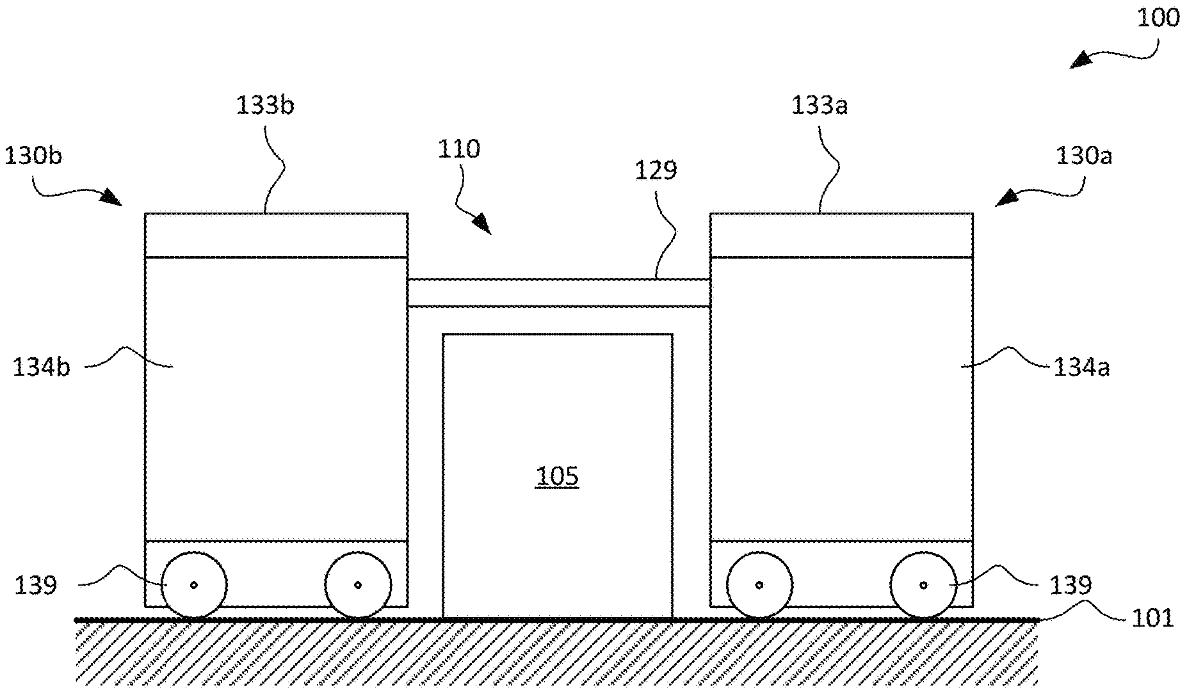
FIG. 8 is a side view of the system of FIG. 6 in an open position.

In some embodiments, the outer frame 130 may be movable relative to the inner frame 120 by wheels. For example, as shown in FIG. 6, the left wall 134 and the right wall 135 may comprise one or more wheels 139, which can roll along the ground surface 101 or the base member 140. Accordingly, the outer frame 130 may be movable relative to the inner frame 120 by rolling the wheels 139, which facilitate easier movement between the closed position (shown in FIG. 7) and the open position (shown in FIG. 8). The wheels 139 may be fixed to the left wall 134 and the right wall 135 or may be retractable. For example, the wheels 139 may be on a jacking screw, where rotation of the jacking screw causes upward/downward movement of the wheels 139 and corresponding contact/separation between the ground surface 101 and the left wall 134 and the right wall 135. The wheels 139 may be locked in the closed position and the open position. With retractable wheels 139, the wheels 139 may be retracted when the outer frame 130 is in the closed position, and may extend to allow the outer frame 130 to roll to the open position. Such extension and retraction may be performed manually or by a combination of actuators or motors, and is not limited herein.

Figure 9:
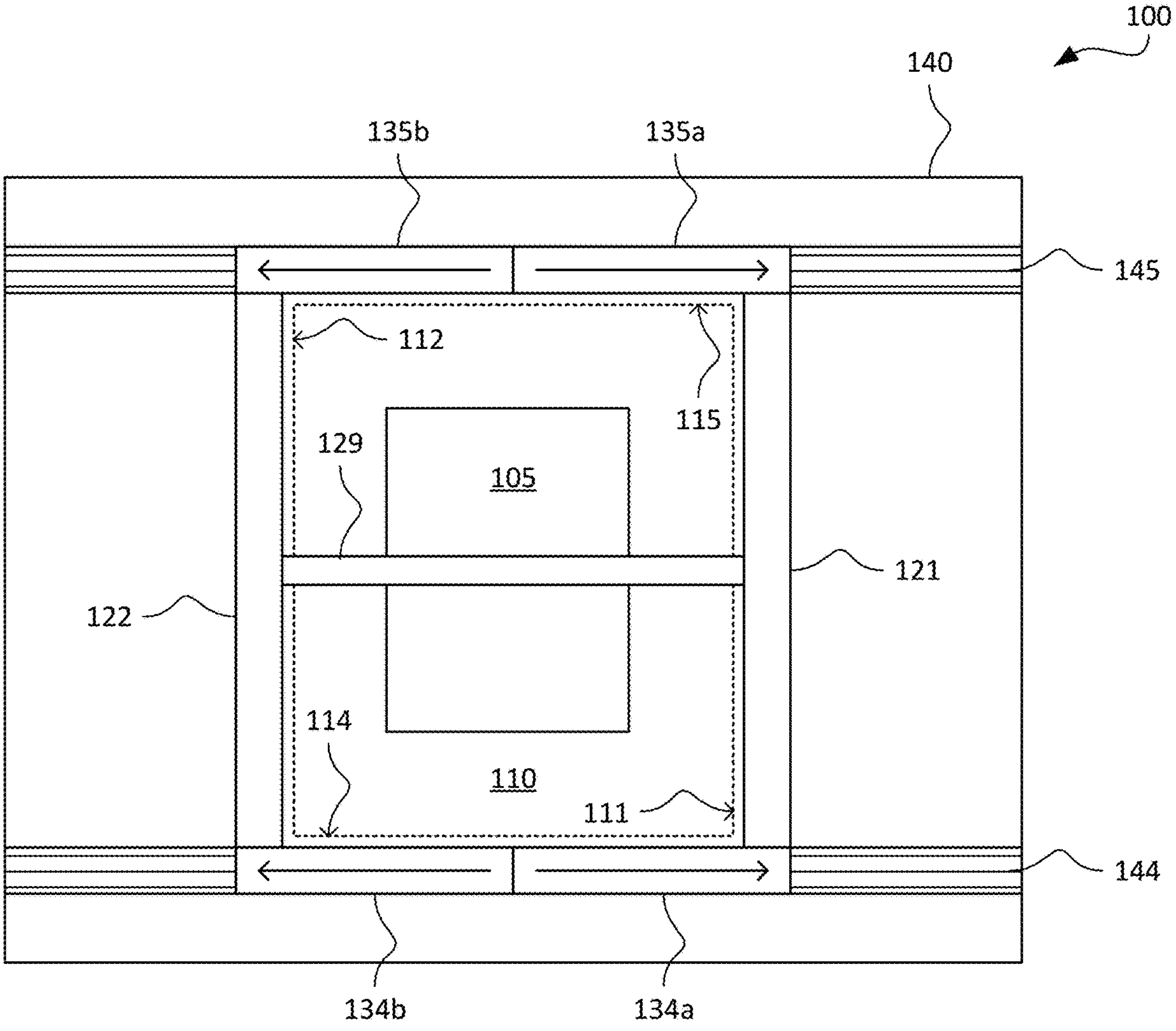
FIG. 9 is a top cross-sectional view of a system of an embodiment of the present disclosure in a closed position.
Figure 10:
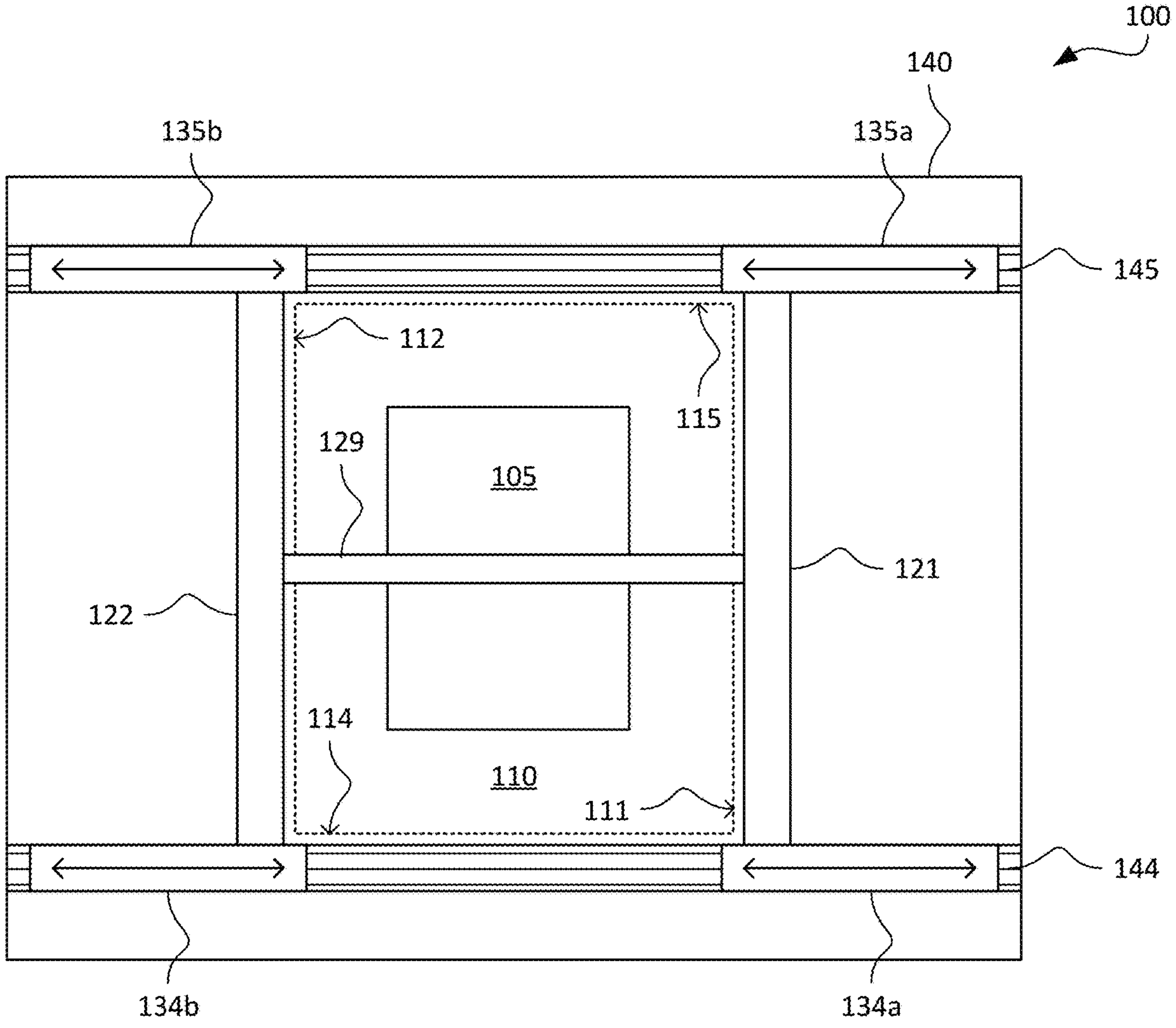
FIG. 10 is a top cross-sectional view of the system of FIG. 9 in an open position.

In some embodiments, the outer frame 130 may be movable relative to the inner frame 120 by sliding. For example, the left wall 134 and the right wall 135 may be slid on the ground surface 101 or the base member 140 to move relative to the inner frame 120. As shown in FIGS. 9 and 10, the base member 140 may comprise a left guide rail 144 and a right guide rail 145, and the left wall 134 and the right wall 135 may be configured to slide within the left guide rail 144 and the right guide rail 145, respectively. The left guide rail 144 and the right guide rail 145 may help keep the sliding segments in alignment while moving and locking the inner frame 120 and the outer frame 130 in the open and closed positions. If the sliding segments were not aligned, parts of the inner frame 120 and the outer frame 130 may contact each other, and may cause difficulty when moving due to friction. The left wall 134 and right wall 135 may also be lifted to move relative to the inner frame 120. For example, the left wall 134 and right wall 135 may be disposed on the ground surface 101 or the base member 140 in the closed position (shown in FIG. 9), lifted from the ground surface 101 or the base member 140, and then slid relative to the inner frame 120 to the open position (shown in FIG. 10). Such lifting and/or sliding may be performed manually or by a combination of actuators or motors, and is not limited herein.

The inner frame 120 may further comprise a raceway 129. The raceway 129 may extend from the front wall 121 to the rear wall 122. The raceway 129 may thereby connect the front wall 121 to the rear wall 122, while maximizing access around the top of the tool 105 for service and maintenance. Electrical wires 106 and/or fluid lines connected to the tool 105 may be routed through the raceway 129, as shown in FIG. 5. The electrical wires 106 and/or fluid lines may drop down from the raceway 129 to connect to the tool 105.

The outer frame 130 may further comprise a control panel 150. The control panel 150 may be disposed on one of the left wall 134 or the right wall 135. In some embodiments, the control panel 150 may be disposed on one of the front wall 121 or the rear wall 122. The control panel 150 may be connected to the electrical wires 106 of the tool 105. For example, the control panel 150 may be connected to the electrical wires 106 by a flexible relief loop 156. The relief loop 156 may have sufficient length and/or flexibility to maintain connection between the control panel 150 and the electrical wires 106 when the outer frame 130 is in the closed position and the open position. In other words, when the outer frame 130 moves relative to the inner frame 120, the relief loop 156 may extend and/or flexibly comply to maintain the connection between the control panel 150 and the electrical wires 106, despite the control panel 150 being in a different relative position. In some embodiments, the relief loop 156 may be extra length of the electrical wires 106 that relaxes and sags when the outer frame 130 is in the closed position and tightens when the outer frame 130 is in the open position. Alternatively, the relief loop 156 may be a separate component connected to the electrical wires 106 that moves or adapts based on the position of the outer frame 130. The control panel 150 may be configured to receive instructions which cause the tool 105 to perform a metrology or inspection process. The manner which the control panel 150 may receive or execute instructions may vary and is not limited herein.

In some embodiments, the outer frame 130 may comprise one or more sections that are independently (or dependently) moveable relative to the inner frame 120. For example, as shown in FIGS. 3-5, the outer frame 130 may comprise a first section 130*a* and a second section 130*b*. The first section 130*a* may comprise a first top wall 133*a*, a first left wall 134*a*, and a first right wall 135*a* (shown in FIG. 3), and the second section 130*b* may comprise a second top wall 133*b*, a second left wall 134*b*, and a second right wall 135*b* (shown in FIG. 4). The individual walls of the first section 130*a* and the second section 130*b* may collectively cover the top side 113, left side 114, and right side 115 of the interior volume 110 in the closed position, and the walls of the first section 130*a* and/or second section 130*b* may be moved such that at least a portion of the top side 113, left side 114, and right side 115 of the interior volume 110 are open to the exterior in the open position (as shown in FIG. 5). The first section 130*a* may be locked with the second section 130*b* in the closed position to prevent accidental movement. For example, the first section 130*a* and the second section 130*b* may be locked using a sealing plate connected to each section. The sealing plate may be hingedly connected to one of the sections and connected to the other section when locked. The number of sections of the outer frame 130 is not limited herein. The individual walls of the first section 130*a* and the second section 130*b* may individually and collectively share the features of the outer frame 130 described above, which are not repeated here.

In some embodiments, the first section 130*a* and the second section 130*b* may be coplanar. In other words, the first top wall 133*a* and the second top wall 133*b* may be coplanar; the first left wall 134*a* and the second left wall 134*b* may be coplanar; and the first right wall 135*a* and the second right wall 135*b* may be coplanar. Accordingly, the individual walls of the first section 130*a* and the second section 130*b* may mate end-to-end in the closed position, and may be separated in the open position. In some embodiments, ends of the first section 130*a* and the second section 130*b* may form a lap joint when mated together. The individual walls of the first section 130*a* and the second section 130*b* may be moved by wheels 139 or slid within the left guide rail 144 and the right guide rail 145 of the base member 140.

Figure 11:
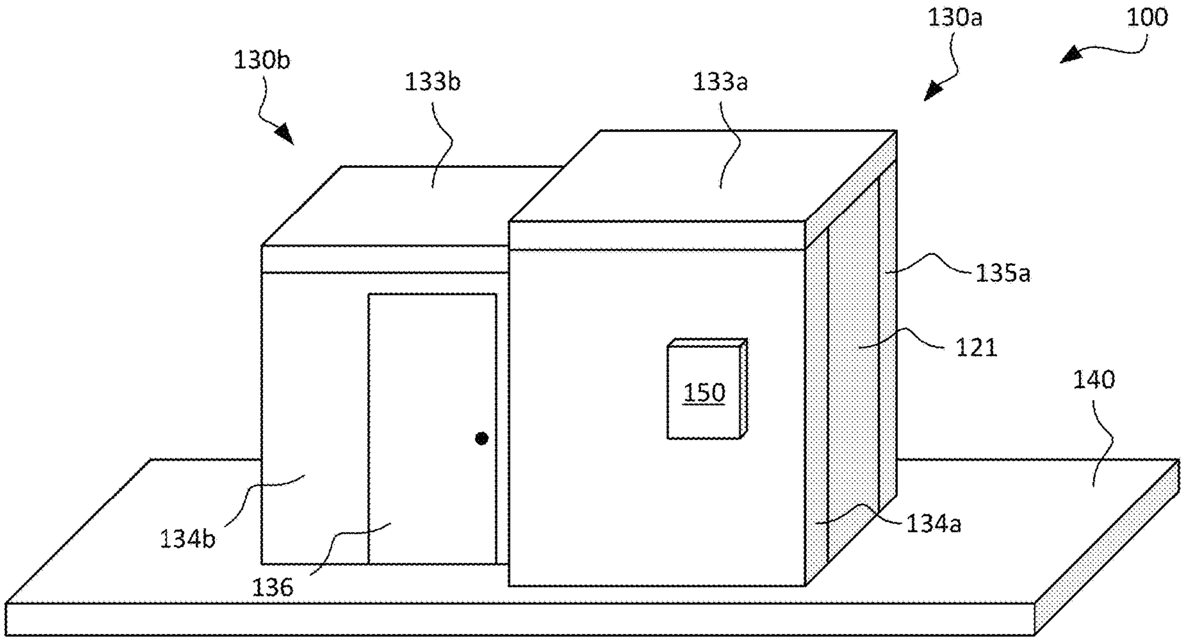
FIG. 11 is a front perspective view of a system of another embodiment of the present disclosure in a closed position.
Figure 12:
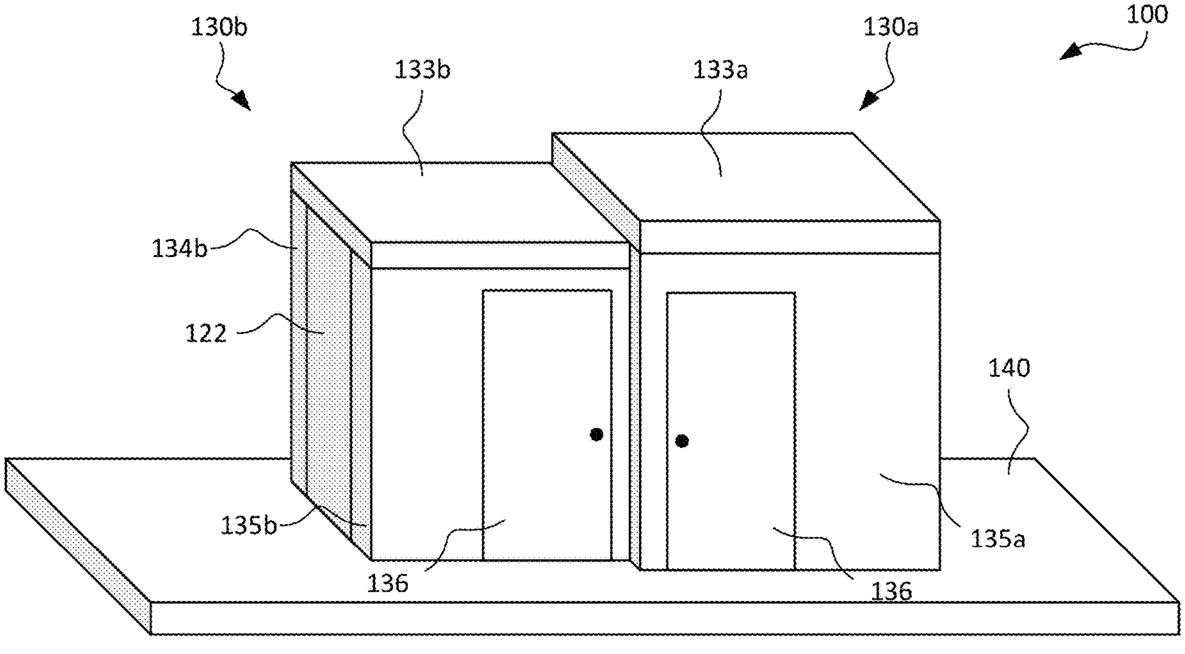
FIG. 12 is a rear perspective view of the system of FIG. 11 in the closed position.
Figure 13:
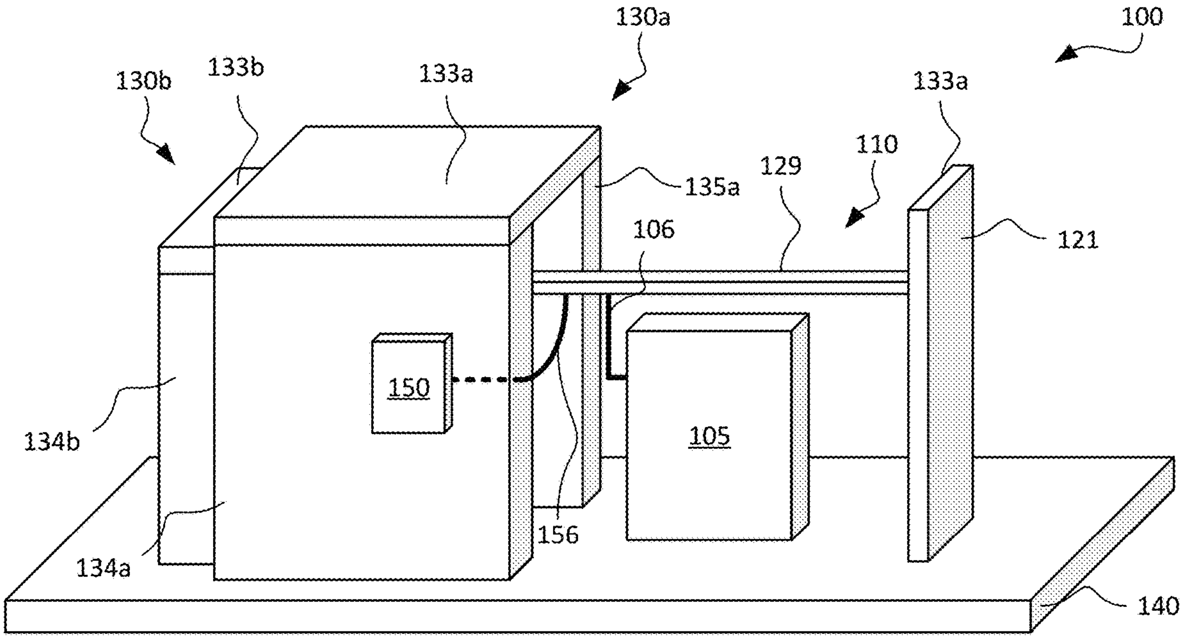
FIG. 13 is a front perspective view of the system of FIG. 11 in an open position.
Figure 14:
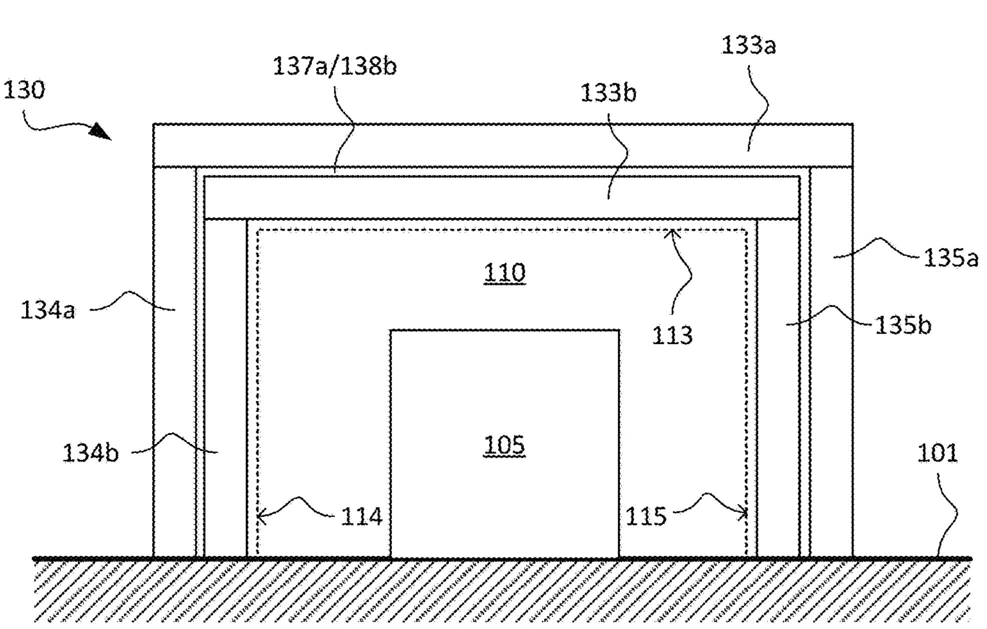
FIG. 14 is a front cross-sectional view of a system of another embodiment of the present disclosure.
Figure 15:
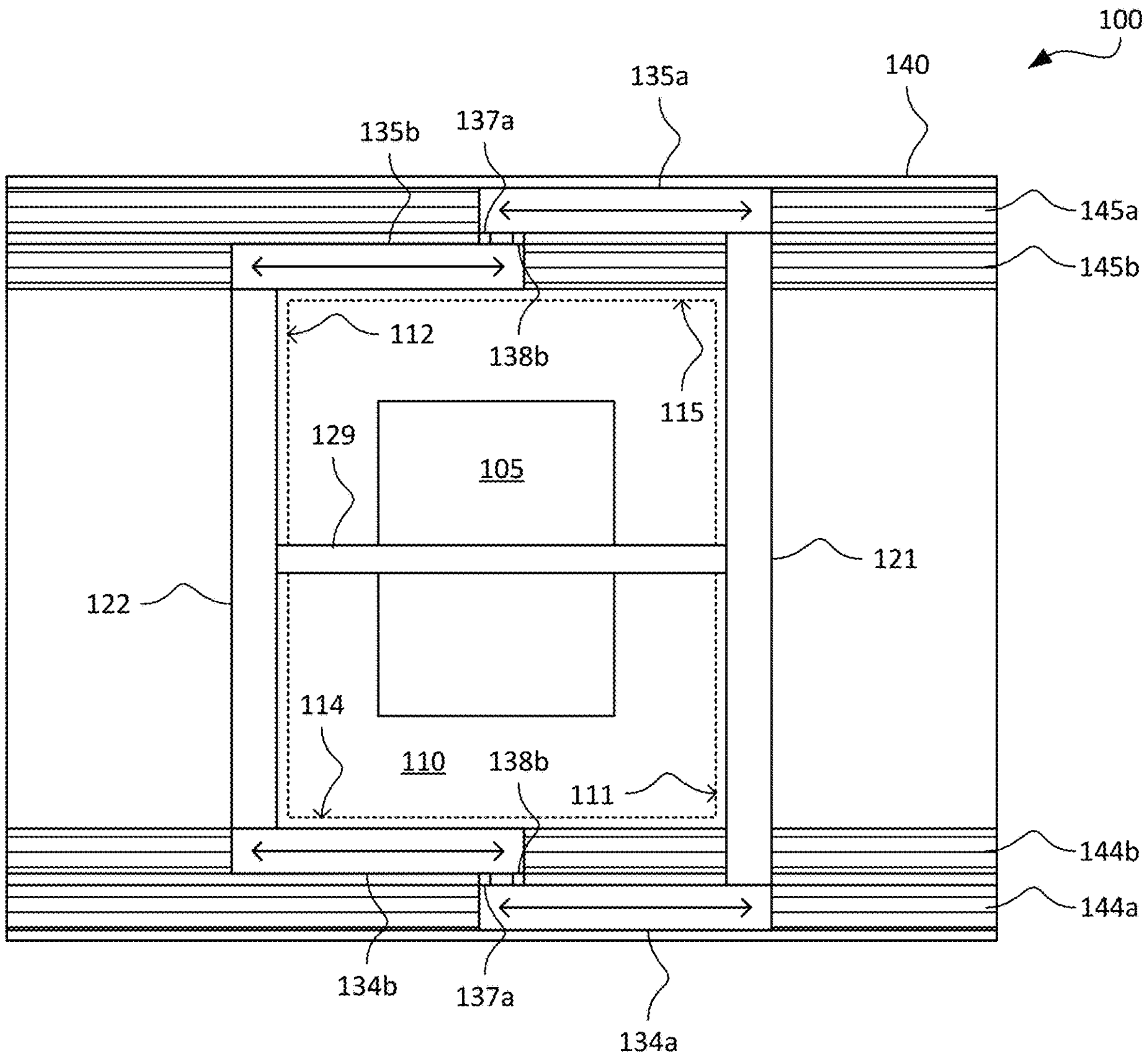
FIG. 15 is a top cross-sectional view of a system another embodiment of the present disclosure in a closed position.
Figure 16:
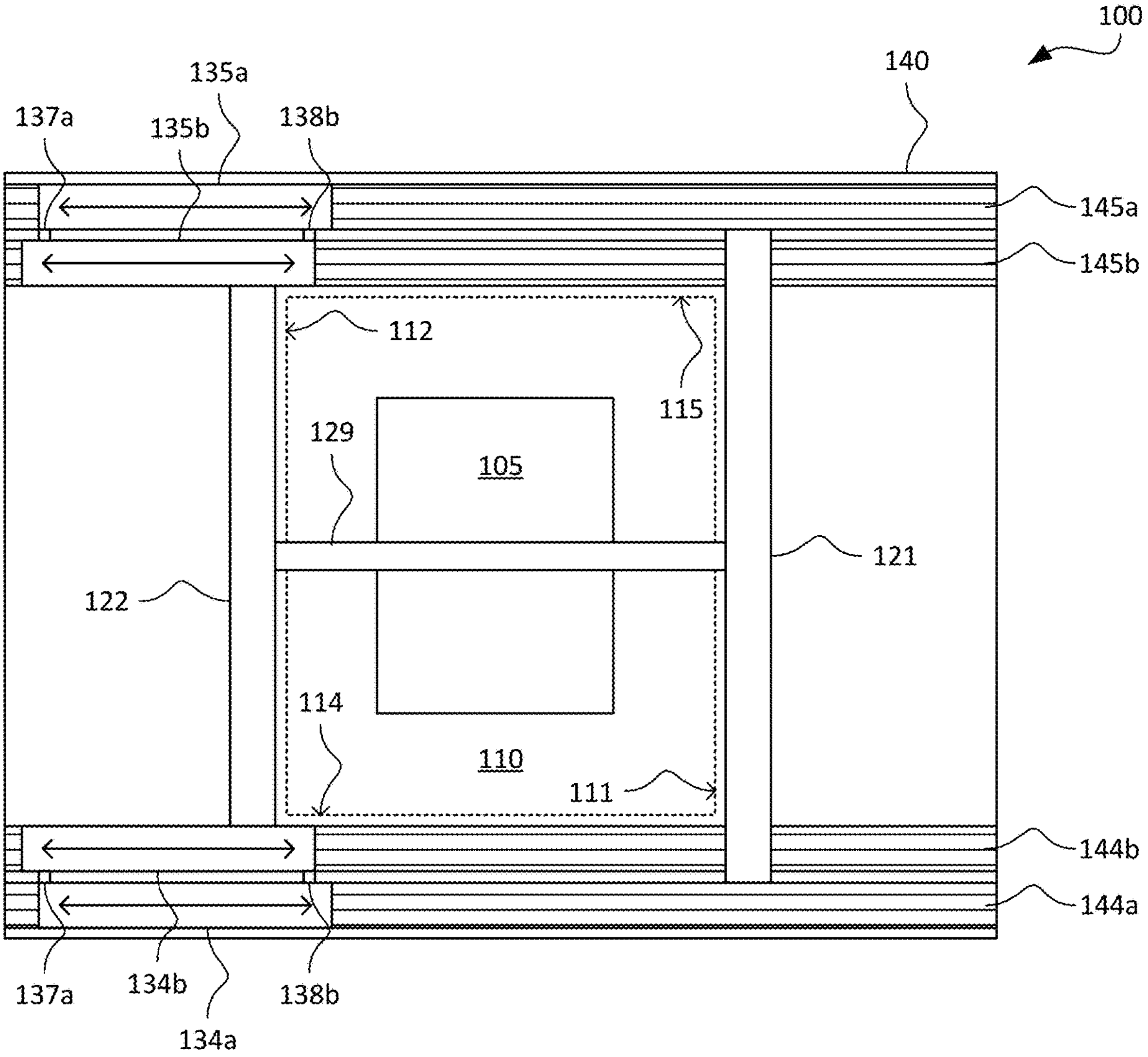
FIG. 16 is a top cross-sectional view of the system of FIG. 15 in an open position.

In some embodiments, the first section 130*a* and the second section 130*b* may be parallel. In other words, the first top wall 133*a* and the second top wall 133*b* may be parallel; the first left wall 134*a* and the second left wall 134*b* may be parallel; and the first right wall 135*a* and the second right wall 135*b* may be parallel. The individual walls of the first section 130*a* may be larger than those of the second section 130*b*, as shown in FIGS. 11 and 12. Accordingly, the individual walls of the first section 130*a* may be disposed on the respective walls of the second section 130*b* in the open position (shown in FIG. 13). Such an arrangement may produce a telescoping effect, where sections of the outer frame 130 are stacked upon each other in the open position. As shown in FIGS. 14-16, each of the walls of the first section 130*a* may have an inner flange 137*a* protruding inwardly toward the interior volume 110, and each of the walls of the second section 130*b* may have an outer flange 138*b* protruding outwardly from the interior volume 110. In the closed position, shown in FIG. 15, the inner flange 137*a* and the outer flange 138*b* may engage one another, so as to at least partially seal the first section 130*a* to the second section 130*b*. An elastomeric seal may be provided between the inner flange 137*a* and the outer flange 138*b* to seal these components together in the closed position. As the first section 130*a* is moved relative to the inner frame 120 to the open position, shown in FIG. 16, the inner flange 137*a* and the outer flange 138*b* may separate, allowing the first section 130*a* to be disposed on the second section 130*b*. In some embodiments where the outer frame 130 comprises more than two sections, each of the walls of the second section 130*b* may further comprise an inner flange 137*b* protruding inwardly toward the interior volume. The inner flange 137*b* may engage with the outer flange of the subsequent section, similar to the inner flange 137*a* described above to further produce the telescoping effect. The individual walls of the first section 130*a* and the second section 130*b* may be moved by wheels 139 or slid within a first left guide rail 144*a* and first right guide rail 145*a* and a second left guide rail 144*b* and second right guide rail 145*b* of the base member 140.

With the system 100, the inner frame 120 and the outer frame 130 may provide an enclosure for the tool 105 that may provide an environment to maintain cleanliness, temperature regulation, electromagnetic interference shielding, and acoustic isolation to the tool 105. Furthermore, the outer frame 130 can be moved relative to the inner frame 120 to expose the tool 105 to the exterior. Such movement can be performed with reduced effort and improves access for service and troubleshooting, which reduces system downtime and throughput.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

an inner frame defining an interior volume, wherein the inner frame comprises a front wall and a rear wall covering respective front and rear sides of the interior volume;

a tool disposed in the interior volume, wherein the tool is a semiconductor metrology tool or a semiconductor inspection tool; and an outer frame disposed on the inner frame, wherein the outer frame comprises:

a first section comprising a first top wall, a first left wall, and a first right wall; and a second section comprising a second top wall, a second left wall, and a second right wall;

wherein in a closed position, the first top wall, the second top wall, the first left wall, the second left wall, the first right wall, and the second right wall cover respective top, left, and right sides of the interior volume, the interior volume is at least partially sealed from an exterior outside the outer frame, and the first section is sealed with the second section;

wherein the first top wall, the first left wall, and the first right wall of the first section and the second top wall, the second left wall, and the second right wall of the second section of the outer frame are movable relative to the inner frame to an open position where at least a portion of the top, left, and right sides of the interior volume are open to the exterior.

2. The system of claim 1, wherein the first section and the second section are independently movable relative to the inner frame.

3. The system of claim 1, wherein the first section and the second section are coplanar, and in the open position, the first section is separated from the second section.

4. The system of claim 1, wherein the first section and the second section are parallel, and in the open position, the first section is disposed on top of the second section.

5. The system of claim 1, wherein the front wall and the rear wall of the inner frame comprise acoustic dampening panels.

6. The system of claim 1, wherein the first top wall, the second top wall, the first left wall, the second left wall, the first right wall, and the second right wall of the outer frame comprise acoustic dampening panels.

7. The system of claim 1, wherein the inner frame is secured to a ground surface.

8. The system of claim 1, further comprising:

a base member, wherein the inner frame and the outer frame are disposed on top of the base member.

9. The system of claim 8, wherein the base member comprises guide rails, and the outer frame is movable relative to the inner frame by sliding within the guide rails.

10. The system of claim 1, wherein the first left wall, the second left wall, the first right wall, and the second right wall of the outer frame include wheels, and the outer frame is movable relative to the inner frame by rolling the wheels.

11. The system of claim 10, wherein the wheels are retracted in the closed position and extend to allow the outer frame to move relative to the inner frame to the open position by rolling.

12. The system of claim 1, wherein in the closed position, the interior volume is temperature controlled and at least partially insulated from the exterior.

13. The system of claim 1, wherein in the open position, the tool is accessible from the top, left, and right sides of the interior volume.

14. The system of claim 1, wherein the inner frame further comprises a raceway for routing electrical wires and/or fluid lines connected to the tool.

15. The system of claim 14, wherein the outer frame further comprises a control panel disposed on one of the first right wall or the first left wall, wherein the control panel is connected the electrical wires of the tool in the raceway via a flexible relief loop, which maintains the connection between the control panel and the electrical wires of the tool when the outer frame is in the open position and the closed position.

16. The system of claim 1, wherein at least one of the first left wall, the second left wall, the first right wall, and the second right wall of the outer frame comprises a door that is openable when the outer frame is in the closed position.

17. The system of claim 1, wherein at least one of the first left wall, the second left wall, the first right wall, and the second right wall of the outer frame is at least partially transparent.

18. The system of claim 1, wherein in the closed position, the interior volume is partially sealed from the exterior, with a leak rate of 20% or less.

19. The system of claim 1, wherein in the closed position, a pressure differential between the interior volume and the exterior causes outward airflow between the inner frame and the outer frame.

20. The system of claim 1, wherein in the closed position, the inner frame and the outer frame shield the interior volume from electromagnetic interference.

* * * * *